(12) United States Patent
Roh

(10) Patent No.: US 7,233,277 B2
(45) Date of Patent: Jun. 19, 2007

(54) IMAGE PICK-UP SEMICONDUCTOR DEVICE CAPABLE OF TESTING OPERATING CHARACTERISTICS OF AN ANALOG-DIGITAL CONVERTER THEREOF

(75) Inventor: Jae-Seob Roh, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/318,888

(22) Filed: Dec. 27, 2005

(65) Prior Publication Data

US 2006/0214821 A1    Sep. 28, 2006

(30) Foreign Application Priority Data

Mar. 23, 2005   (KR) .................... 10-2005-0024075

(51) Int. Cl.
*H03M 1/56* (2006.01)
(52) U.S. Cl. ..................................... 341/169; 341/155
(58) Field of Classification Search ........ 341/118–122, 341/169, 155; 348/180, 241, 301, 302
See application file for complete search history.

(56) References Cited

U.S. PATENT DOCUMENTS 5,276,400 A * 1/1994 Denyer et al. .............. 324/750
5,877,715 A   3/1999 Gowda et al.
6,366,312 B1 * 4/2002 Crittenden .................. 348/187
6,583,817 B1   6/2003 Lee
6,734,897 B1 * 5/2004 Mentzer ..................... 348/180
6,903,670 B1 * 6/2005 Lee et al. ................... 341/118

FOREIGN PATENT DOCUMENTS

KR   10/20030037212 A1   5/2003
KR   1020040095990       11/2004

\* cited by examiner

*Primary Examiner*—Brian Young
(74) *Attorney, Agent, or Firm*—F. Chau & Associates, LLP

(57) ABSTRACT

Provided is an image pick-up semiconductor device capable of testing operating characteristics of an analog-digital converter while the image pick-up semiconductor device operates. The device includes an active pixel sensor array having a plurality of pixels converting optical signals input from an external source into electrical signals, a columnar analog-digital converter converting signals output from the active pixel sensor array into first digital data, and a test analog-digital converter receiving two external signals and converting a voltage difference between the two external signals into second digital data.

25 Claims, 6 Drawing Sheets

IMAGE PICK-UP SEMICONDUCTOR DEVICE CAPABLE OF TESTING OPERATING CHARACTERISTICS OF AN ANALOG-DIGITAL CONVERTER THEREOF

CROSS-REFERENCE TO RELATED APPLICATION

This application claims priority to Korean Patent Application No. 10-2005-0024075, filed on Mar. 23, 2005, in the Korean Intellectual Property Office, the disclosure of which is incorporated by reference herein in its entirety.

1. Technical Field

The present invention relates to an image pickup semiconductor device, and more particularly, to an image pick-up semiconductor device capable of testing operating characteristics of an analog-digital converter included therein while the image pick-up semiconductor device operates.

2. Discussion of the Related Art

When taking a photograph of a person or an object using an image pick-up semiconductor device such as a digital camera, an input optical signal is converted into digital data and the person or object is reproduced as an image on a screen of the digital camera or a computer using the digital data.

FIG. 1 is a block diagram of a conventional image pick-up semiconductor device 101. Referring to FIG. 1, the image pick-up semiconductor device 101 includes an active pixel sensor (APS) array 111, analog-digital converters 121 and 122, and a row driver 131.

The APS array 111 includes a plurality of pixels (not shown) and converts optical signals input from an external source into electrical signals. The analog-digital converters 121 and 122 convert the electrical signals output from the APS array 111 into digital data and output the digital data.

The row driver 131 addresses the pixels in the APS array 111. Electrical signals output from pixels selected by the row driver 131 are transmitted to the analog-digital converters 121 and 122.

As shown in FIG. 1, the analog-to-digital converters 121 and 122 do not include test nodes. Therefore, while the image pick-up semiconductor device 101 operates, operating characteristics of the analog-digital converters 121 and 122 cannot be tested externally.

When, however, test nodes are inserted into the analog-to-digital converters 121 and 122, output signals of the pixels of the APS array 111 are severely distorted or weakened by a load capacitance of the test nodes. Thus, the signals output from the converters 121 and 122 may be erroneous.

Thus, when the analog-digital converters 121 and 122 operate improperly, a person or object photographed by an image pick-up device including the image pick-up semiconductor device 101 is not accurately reproduced on a screen. A need therefore exists for an apparatus and method of testing the operating characteristics of the analog-digital converters 121 and 122 and correcting errors while the image pick-up semiconductor device 101 operates.

SUMMARY OF THE INVENTION

The present invention provides an image pick-up semiconductor device capable of testing operating characteristics of an analog-digital converter included therein while the image pick-up semiconductor device operates.

According to an aspect of the present invention, there is provided an image pick-up semiconductor device including: an active pixel sensor array having a plurality of pixels converting optical signals input from an external source into electrical signals; a columnar analog-digital converter converting the electrical signals output from the active pixel sensor array into first digital data; and a test analog-digital converter receiving two external signals and converting a voltage difference between the two external signals into second digital data.

The columnar analog-digital converter may include: a ramp voltage generator generating a ramp voltage; a plurality of correlated double sampling units electrically connected to the pixels and each of the correlated double sampling units sampling a first electrical signal output from a first pixel at a first time and sampling a second electrical signal output from the first pixel at a second time; a plurality of comparators receiving output signals of the correlated double sampling units and the ramp voltage output from the ramp voltage generator and comparing voltage levels of the output signals and the ramp voltage; a counter receiving a clock signal and a count enable signal input from an external source, and counting and outputting a number of pulses of the clock signal from when the ramp voltage generator starts to output the ramp voltage; and a plurality of latch units storing digital data output from the counter as the first digital data when voltage levels of output signals of the comparators are inverted.

The test analog-digital converter may include: a test correlated double sampling unit sampling each of the two external signals; a test comparator receiving an output signal of the test correlated double sampling unit and the ramp voltage output from the ramp voltage generator and comparing voltage levels of the two output signals; and a test latch unit receiving an output signal of the test comparator, wherein the counter counts and outputs the number of pulses of the clock signal from when the ramp voltage starts to rise, and the test latch unit stores the number of pulses of the clock signals counted as the second digital data until the output signal of the test comparator is inverted.

According to another aspect of the present invention, there is provided an image pick-up semiconductor device including: an active pixel sensor array in which a plurality of pixels converting optical signals input from an external source into electrical signals are arranged; a plurality of columnar analog-digital converters disposed on sides of the active pixel sensor array and converting signals output from the active pixel sensor array into first digital data; and a plurality of test analog-digital converters disposed on the sides of the active pixel sensor array, receiving two external signals, and converting a voltage difference between the two external signals into second digital data.

Each of the columnar analog-digital converters may include: a ramp voltage generator generating a ramp voltage; a plurality of correlated double sampling units electrically connected to the pixels and each of the correlated double sampling units sampling a first electrical signal output from a first pixel at a first time and sampling a second electrical signal output from the first pixel at a second time; a plurality of comparators receiving output signals of the correlated double sampling units and the ramp voltage output from the ramp voltage generator and comparing voltage levels of the output signals and the ramp voltage; a counter receiving a clock signal and a count enable signal input from an external source, and counting and outputting a number of pulses of the clock signal from when the ramp voltage generator starts to output the ramp voltage; and a plurality of latch units storing digital data output from the counter as the first digital data when voltage levels of output signals of the comparators are inverted.

Each of the test analog-digital converters may include: a test correlated double sampling unit sampling each of the two external signals; a test comparator receiving an output signal of the test correlated double sampling unit and the ramp voltage output from the ramp voltage generator and comparing voltage levels of the two output signals; and a test latch unit receiving an output signal of the test comparator, wherein the counter counts and outputs the number of pulses of the clock signal from when the ramp voltage starts to rise, and the test latch unit stores the number of pulses of the clock signals counted as the second digital data until the output signal of the test comparator is inverted.

According to yet another aspect of the present invention, there is provided a method for testing operating characteristics in an image pick-up semiconductor device, comprising: converting, at an active pixel sensor in which a plurality of pixels are arranged, optical signals input from an external source into electrical signals; converting, at a column analog-digital converter, the electrical signals output from the active pixel sensor array into first digital data; and receiving, at a test analog-digital converter, two external signals and converting a voltage difference between the two external signals into second digital data.

The method further comprises: setting the voltage difference between the two external signals to a saturated voltage of the pixels; and determining an amount of saturated signals in the image pick-up semiconductor device based on the second digital data.

The method further comprises: setting the two external signals to a same voltage level; and determining an offset voltage of the columnar analog-digital converter based on the second digital data. If a non-zero offset voltage has been determined, setting the offset voltage to zero by adjusting a counter of the columnar analog-digital converter.

The method further comprises: increasing the voltage difference of the two external signals; and determining if gain characteristics of the columnar analog-digital converter are stable based on whether the second digital data increases at a same rate as the increase in the voltage difference of the two external signals.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
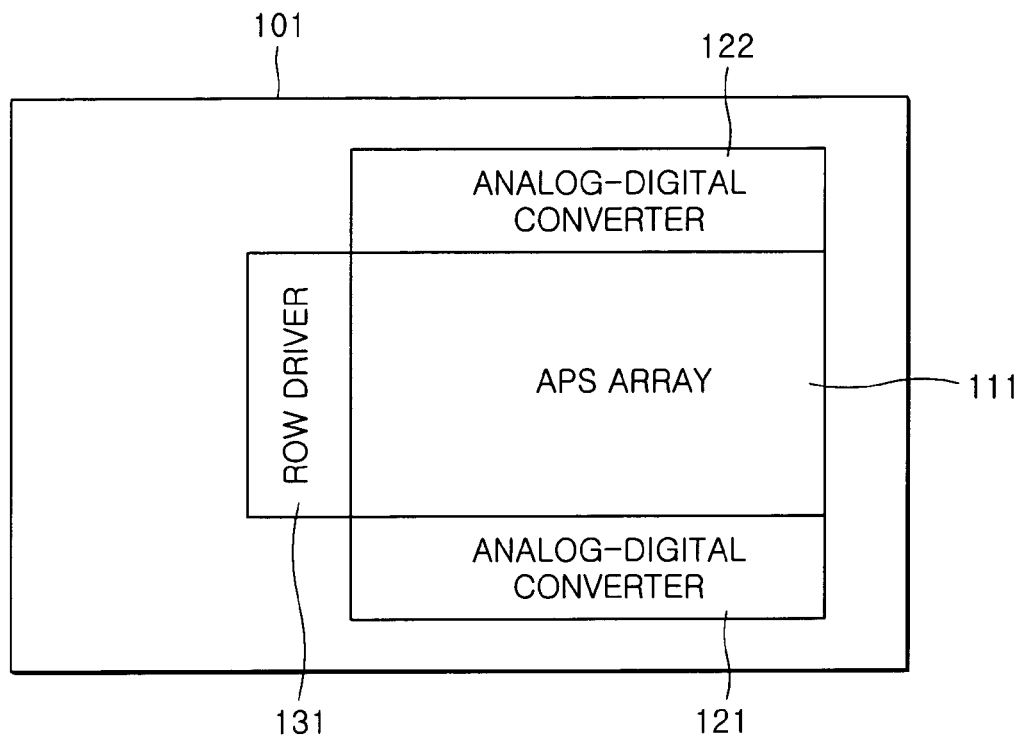
FIG. 1 is block diagram of a conventional image pick-up semiconductor device.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

Figure 2:
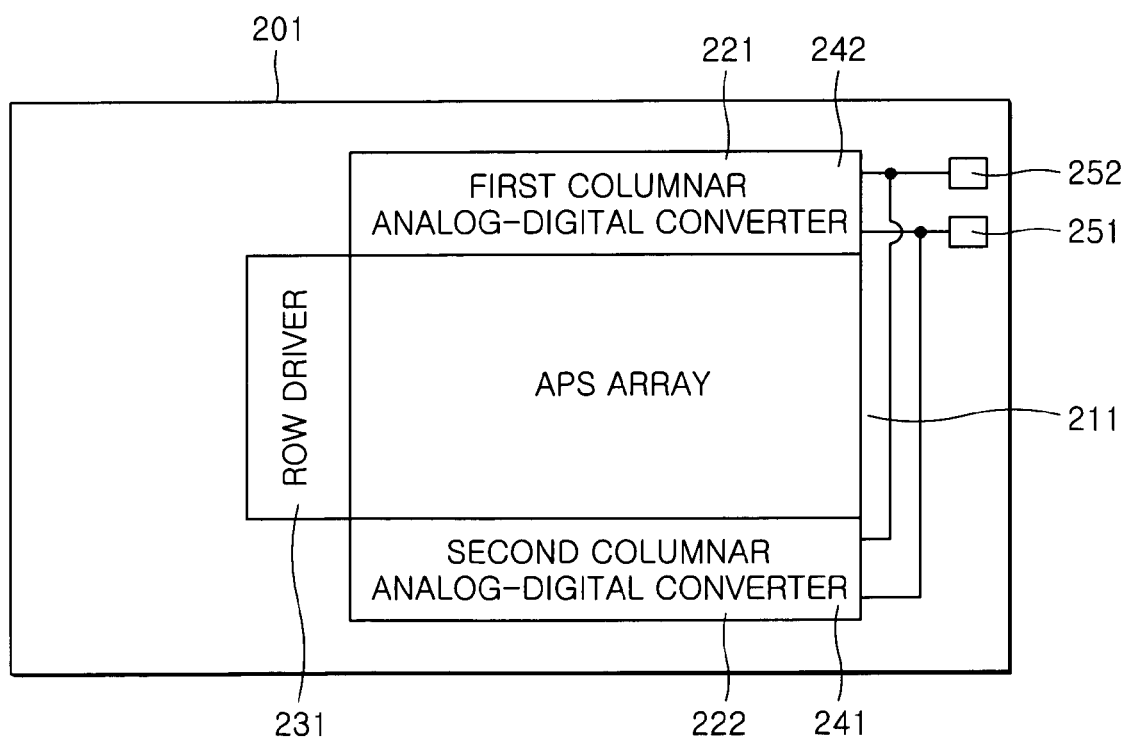
FIG. 2 is a block diagram of an image pick-up semiconductor device according to an exemplary embodiment of the present invention.

FIG. 2 is a block diagram of an image pick-up semiconductor device 201 according to an exemplary embodiment of the present invention. Referring to FIG. 2, the image pick-up semiconductor device 201 includes an active pixel sensor (APS) array 211, first and second columnar analog-digital converters 221 and 222, a row driver 231, first and second test analog-digital converters 241 and 242, and test pads 251 and 252.

Figure 3:
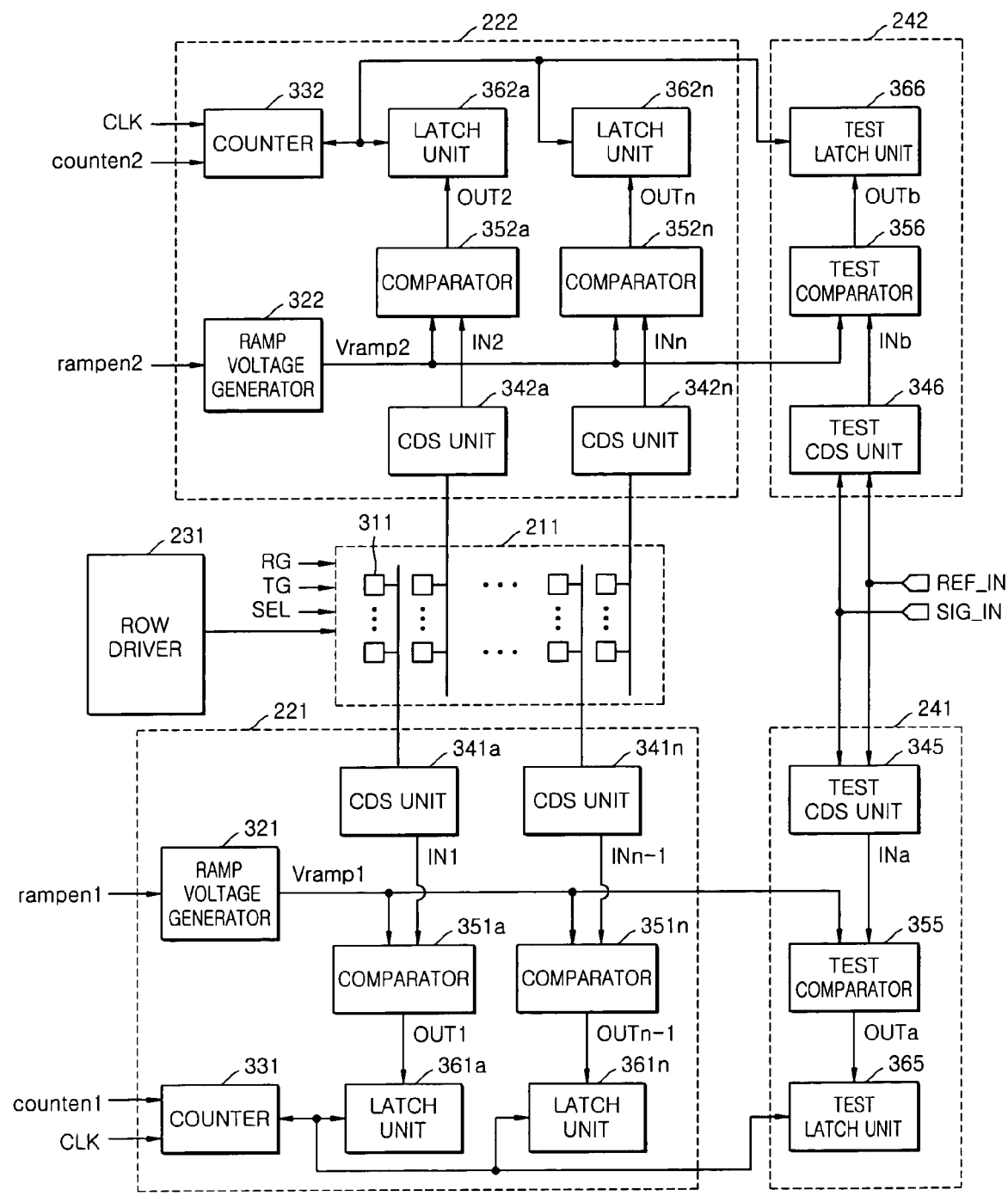
FIG. 3 is a detailed block diagram of the image pick-up semiconductor device of FIG. 2.

The APS array 211 includes a plurality of pixels 311 as illustrated in FIG. 3 and converts optical signals input from an external source into electrical signals. The first and second columnar analog-digital converters 221 and 222 respectively convert the electrical signals output from the APS array 211 into digital data and output the digital data.

The row driver 231 addresses the pixels 311 included in the APS array 211. Electrical signals output from pixels selected by the row driver 231 are transmitted to the first and second columnar analog-digital converters 221 and 222.

The first and second test analog-digital converters 241 and 242 output digital data in response to first and second test signals REF_IN and SIG_IN, which are input from an external source through the test pads 251 and 252. The first and second test analog-digital converters 241 and 242 may be manufactured by the same processes and under the same conditions as the first and second columnar analog-digital converters 221 and 222. Therefore, the first and second test analog-digital converters 241 and 242 have identical operating characteristics to the first and second columnar analog-digital converters 221 and 222. The first and second test signals REF_IN and SIG_IN may also be one signal having two voltage levels.

In addition, the first and second test analog-digital converters 241 and 242 are not additionally implemented in the image pick-up semiconductor device 201 since existing dummy analog-digital converters are used as the first and second test analog-digital converters 241 and 242. Hence, although the image pick-up semiconductor device 201 includes the first and second test analog-digital converters 241 and 242, it is not bigger than the conventional image pick-up semiconductor device 101. Further, the image pick-up semiconductor device 201 may be configured to include one columnar analog-digital converter and one test analog-digital converter.

As shown in FIG. 2, the first and second test analog-digital converters 241 and 242 operate independently of the first and second columnar analog-digital converters 221 and 222. Thus, when the image pick-up semiconductor device 201 operates, the operating characteristics of the first and second test analog-digital converters 221 and 222 can be tested, thereby identifying the operating characteristics of the first and second columnar analog-digital converters 221 and 222.

FIG. 3 is a detailed block diagram of the image pick-up semiconductor device 201 of FIG. 2. Referring to FIG. 3, the first columnar analog-digital converter 221 includes a ramp voltage generator 321, a counter 331, a plurality of correlated double sampling (CDS) units 341a through 341n, a plurality of comparators 351a through 351n, and a plurality of latch units 361a through 361n. The second columnar analog-digital converter 222 includes a ramp voltage generator 322, a counter 332, a plurality of CDS units 342a through 342n, a plurality of comparators 352a through 352n, and a plurality of latch units 362a through 362n.

The ramp voltage generators 321 and 322 respectively generate and output ramp voltages Vramp1 and Vramp2 in response to ramp enable signals rampen1 and rampen2 input from an external source. For example, when the ramp enable signals rampen1 and rampen2 become active to a logic high state, the ramp voltage generators 321 and 322 output the ramp voltages Vramp1 and Vramp2, respectively. When the ramp enable signals rampen1 and rampen2 become inactive to a logic low state, the ramp voltage generators 321 and 322 do not output the ramp voltages Vramp1 and Vramp2, respectively. The ramp voltages Vramp1 and Vramp2 increase linearly as illustrated, for example, in FIGS. 5 and 7.

As will be further described hereinafter with reference to FIGS. 5 and 7, signals stored in the CDS units 341a through 341n and 342a through 342n are sampled twice. In other words, the signals stored in the CDS units 341a through 341n and 342a through 342n are read twice.

The comparators 351a through 351n and 352a through 352n receive signals IN1 through INn output from the CDS units 341a through 341n and 342a through 342n, and the ramp voltages Vramp1 and Vramp2 output from the ramp voltage generators 321 and 322, and output the differences between the signals IN1 through INn and the ramp voltages Vramp1 and Vramp2 as output signals OUT1 through OUTn, respectively.

For example, when voltage levels of the ramp voltages Vramp1 and Vramp2 are lower than those of the signals IN1 through INn output from the CDS units 341a through 341n and 342a through 342n, respectively, the output signals OUT1 through OUTn of the comparators 351a through 351n and 352a through 352n become logic low. When the voltage levels of the ramp voltages Vramp1 and Vramp2 are higher than those of the signals IN1 through INn output from the CDS units 341a through 341n and 342a through 342n, respectively, the output signals OUT1 through OUTn of the comparators 351a through 351n and 352a through 352n become logic high.

The counters 331 and 332 respectively receive a clock signal CLK and count enable signals counten1 and counten2 from an external source and count the number of pulses of the clock signal CLK for a predetermined period of time in response to the count enable signals counten1 and counten2. For example, the counters 331 and 332 count the number of pulses of the clock signal CLK from a time when the count enable signals counten1 and counten2 become active from logic low to logic high to a time when the number of pulses of the clock signal CLK are counted by the number of bits of the first and second columnar analog-digital converters 221 and 222. The first and second columnar analog-digital converters 221 and 222 then output the number of counted pulses as digital data. The number of counted pulses is digital data into which voltage sizes of signals stored in the pixels 311 are converted.

When the respective output signals OUT1 through OUTn of the comparators 351a through 351n and 352a through 352n are inverted, for example, when the output signals OUT1 through OUTn switch from logic low to logic high, the latch units 361a through 361n and 362a through 362n store digital data output from the counters 331 and 332, respectively.

Still referring to FIG. 3, the first and second test analog-digital converters 241 and 242 respectively include test CDS units 345 and 346, test comparators 355 and 356, and test latch units 365 and 366. The test CDS units 345 and 346 sample, only once, each of the first and second test signals REF_IN and SIG_IN input through the test pads 251 and 252 and output the sampling result.

The test comparators 355 and 356 receive signals INa and INb output from the test CDS units 345 and 346 and the ramp voltages Vramp1 and Vramp2 output from the ramp voltage generators 321 and 322 and output the differences between the signals INa and INb and the ramp voltages Vramp1 and Vramp2 as output signals OUTa and OUTb, respectively.

For example, when the voltage levels of the ramp voltages Vramp1 and Vramp2 are lower than those of the signals INa and INb output from the test CDS units 345 and 346, respectively, the output signals OUTa and OUTb of the test comparators 355 and 356 become logic low. When the voltage levels of the ramp voltages Vramp1 and Vramp2 are higher than those of the signals INa and INb output from the test CDS units 345 and 346, respectively, the output signals OUTa and OUTb of the test comparators 355 and 356 become logic high.

The counters 331 and 332 respectively count the number of pulses of the clock signal CLK for the predetermined period of time in response to the count enable signals counten1 and counten2. For example, the counters 331 and 332 start to count the number of pulses of the clock signal CLK from a time when the count enable signals counten1 and counten2 become active from logic low to logic high. The first and second test analog-digital converters 241 and 242 then output the number of counted pulses as digital data. The number of counted pulses is digital data into which a voltage difference between the first and second test signals REF_IN and SIG_IN is converted.

When the respective output signals OUTa and OUTb of the test comparators 355 and 356 are inverted, for example, when the output signals OUTa and OUTb switch from logic low to logic high, the test latch units 365 and 366 store digital data output from the counters 331 and 332, respectively.

In the image pick-up semiconductor device 201, the operating characteristics, e.g., the amount of saturated signals, an offset voltage, and gain characteristics of the first and second columnar analog-digital converters 221 and 222 can be tested by setting the voltages of the first and second test signals REF_IN and SIG_IN different from each other.

To test the amount of saturated signals, a voltage difference between the first and second test signals REF_IN and SIG_IN is set to a saturated voltage of the pixels 311, and the voltages of the first and second test signals REF_IN and SIG_IN are applied to the first and second test analog-digital converters 241 and 242. For example, if the saturated voltage of the pixels 311 is 1000 mV and digital data output from the first and second columnar analog-digital converters 221 and 222 is composed of 10 bits, the first test signal REF_IN is set to 0 V and the second test signal SIG_IN is set to 1000 mV. The first and second test signals REF_IN and SIG_IN are then transmitted to the first and second test analog-digital converters 241 and 242, and digital data output from the first and second test analog-digital converters 241 and 242 is tested. The digital data is the amount of saturated signals.

If the digital data is, for example '1024', the first and second columnar analog-digital converters 221 and 222 converted the data properly. However, if the digital data is smaller or bigger than '1024', the first and second columnar analog-digital converters 221 and 222 converted the data improperly.

To test the offset voltage of the first and second columnar analog-digital converters 221 and 222, the first and second test signals REF_IN and SIG_IN are set to the same voltage level and transmitted to the first and second test analog-digital converters 241 and 242. In this state, if digital data output from the first and second test analog-digital converters 241 and 242 is zero, the offset voltage of the first and second columnar analog-digital converters 221 and 222 is zero. However, if the digital data output from the first and second test analog-digital converters 241 and 242 is not zero, the offset voltage of the first and second columnar analog-digital converters 221 and 222 has a non-zero value.

If the first and second columnar analog-digital converters 221 and 222 have a non-zero offset voltage, the offset voltage can be set to zero by adjusting the characteristics of the counters 331 and 332 by the non-zero value of the offset voltage.

To test the gain characteristics of the first and second columnar analog-digital converters 221 and 222, the first and second test signals REF_IN and SIG_IN are transmitted to the first and second test analog-digital converters 241 and 242 while the voltage difference between the first and second test signals REF_IN and SIG_IN is gradually increased.

For example, the voltage difference between the first and second test signals REF_IN and SIG_IN is set to 100 mV, 200 mV, or 400 mV. The set first and second test signals REF_IN and SIG_IN are then transmitted to the first and second test analog-digital converters 241 and 242. Then, it is checked to see whether digital data output from the first and second test analog-digital converters 241 and 242 increases at the same rate as the set voltage differences. If the digital data increases at the same rate, the gain characteristics of the first and second columnar analog-digital converters 221 and 222 are stable. If, however, the digital data does not increase at the same rate, the gain characteristics of the first and second columnar analog-digital converters 221 and 222 are unstable.

Figure 4:
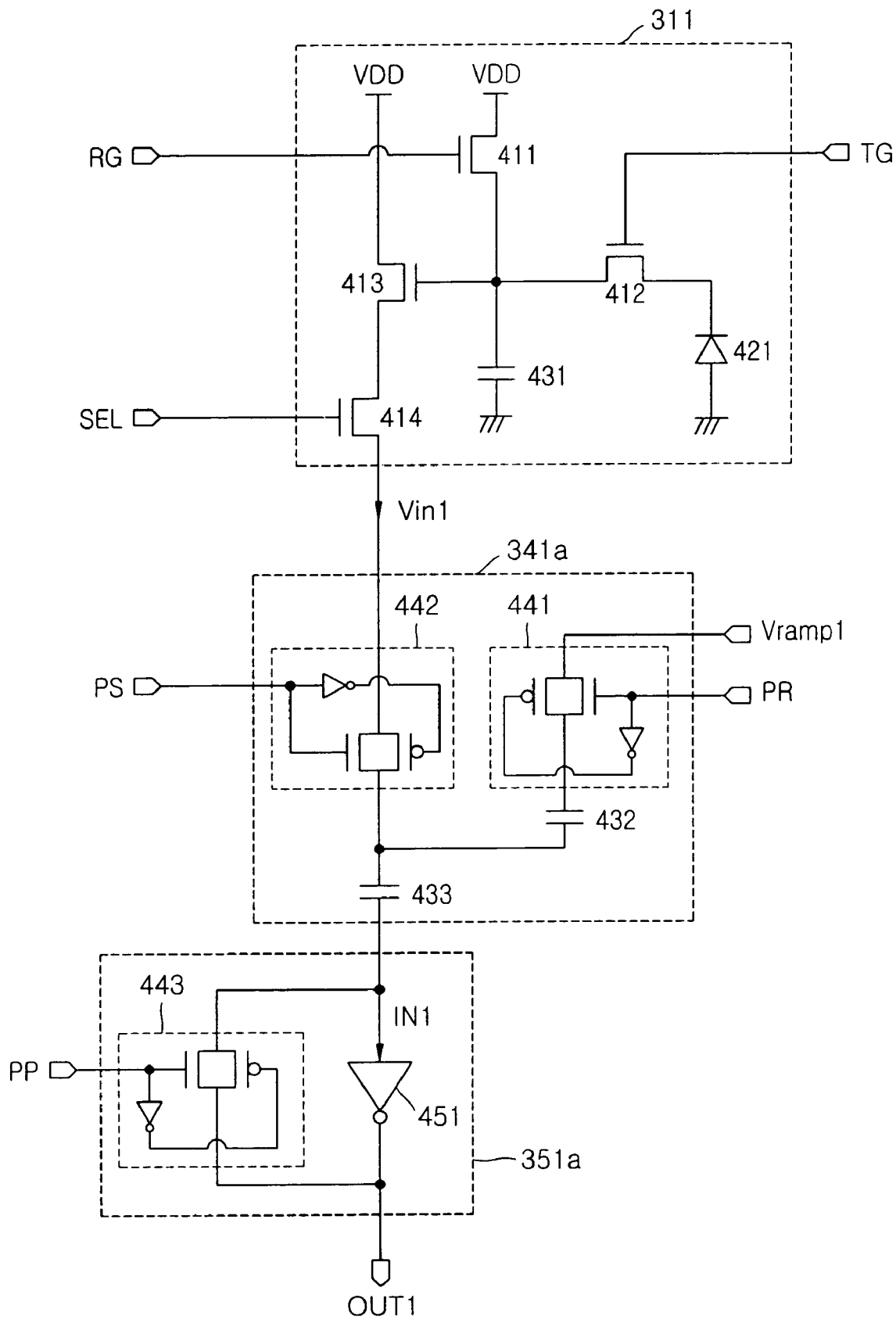
FIG. 4 is a circuit diagram of a pixel, a correlated double sampling (CDS) unit and a comparator included in a first columnar analog-digital converter illustrated in FIG. 3.

FIG. 4 is a circuit diagram of one of the pixels 311, one of the CDS units 341a through 341n and one of the comparators 351a through 351n included in the first columnar analog-digital converter 221 illustrated in FIG. 3. Referring to FIG. 4, the pixel 311 includes a plurality of NMOS transistors 411 through 414, a capacitor 431, and an optical diode 421. The CDS unit 341a includes transmission gates 441 and 442 and capacitors 432 and 433. The comparator 351a includes a transmission gate 443 and an inverter 451.

As shown in FIG. 4, the NMOS transistor 411 is activated when a reset signal RG becomes active to logic high. The NMOS transistor 412 is activated when a transmission signal TG becomes active to logic high. The NMOS transistor 414 is activated when a select signal SEL becomes active to logic high. The transmission gates 441, 442, and 443 are activated when switching signals PS, PR, and PP become active to logic high and deactivated when the switching signals PS, PR, and PP become inactive to logic low.

Figure 5:
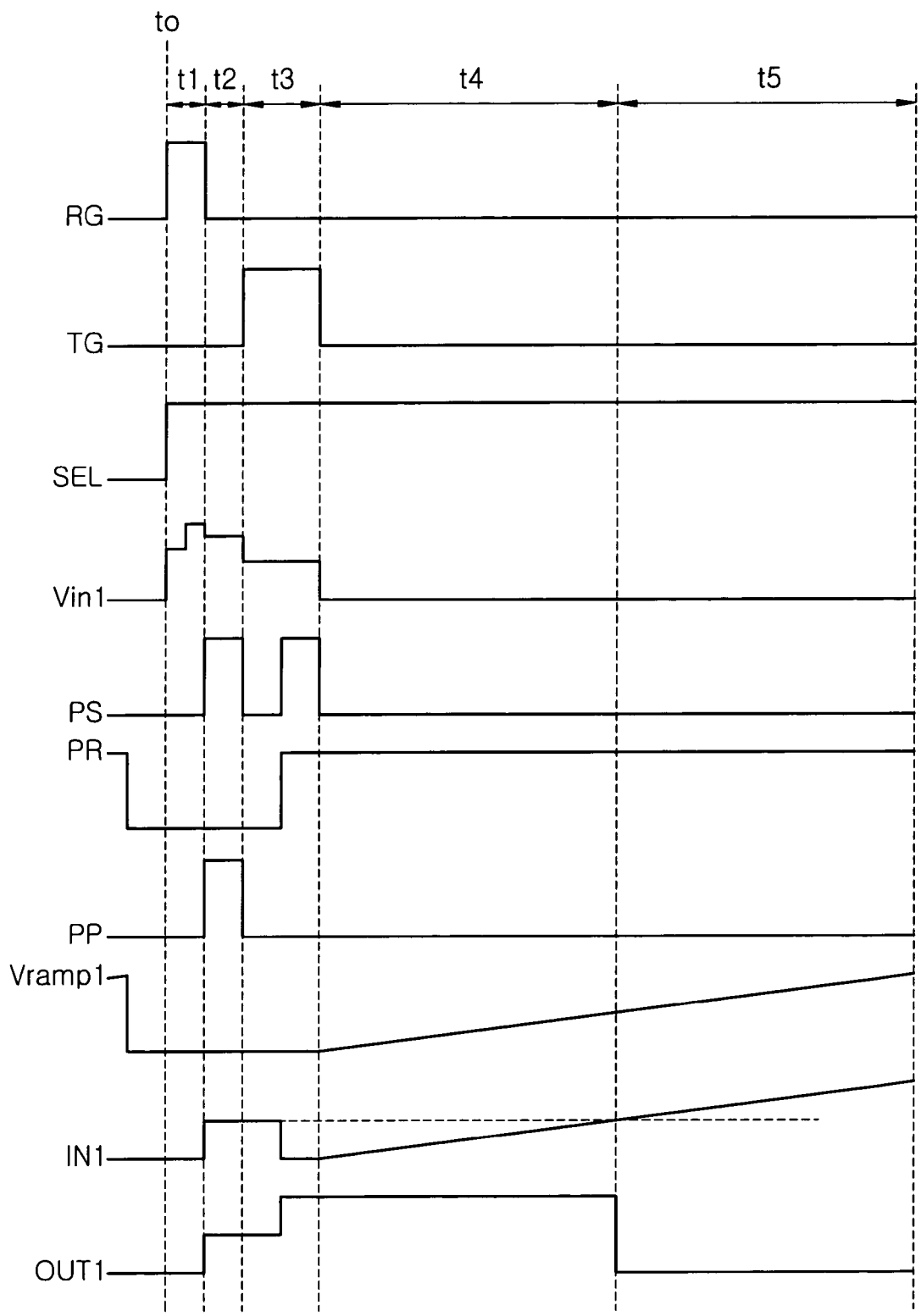
FIG. 5 is a timing diagram of some of signals illustrated in FIGS. 3 and 4 which are used to describe the operation of the first columnar analog-digital converter of FIG. 4.

FIG. 5 is a timing diagram of the signals illustrated in FIGS. 3 and 4. The operation of the first columnar analog-digital converter 221 illustrated in FIGS. 3 and 4 will now be described with reference to FIG. 5.

At an initial time t0, control signals, e.g., the reset signal RG, the transmission signal TG and the select signal SEL, and the switching signals PR, PS and PP are inactive at logic low. Thus, the NMOS transistors 411 through 414 and the transmission gates 441 through 443 are respectively deactivated.

During a first time slot t1, the select signal SEL and the reset signal RG become active to logic high. Then, the NMOS transistors 411 and 414 are activated. When the NMOS transistor 411 is activated, the capacitor 431 is charged and the NMOS transistor 413 is activated by the charged voltage of the capacitor 431. Thus, a signal at a level of a voltage source VDD is transmitted to the transmission gate 442. However, since the transmission gate 442 is deactivated, the signal transmitted to the transmission gate 442 cannot pass through the transmission gate 442.

During a second time slot t2, the reset signal RG becomes inactive to logic low and the switching signals PS and PP become active to logic high. When the reset signal RG switches to logic low, the NMOS transistor 411 is deactivated, thereby slightly lowering the charged voltage of the capacitor 431. Accordingly, the voltage level of the signal transmitted to the transmission gate 442 is lowered.

The transmission gates 442 and 443 are activated by the active switching signals PS and PP. Then, the signal transmitted to the transmission gate 442 passes through the transmission gate 442 and charges the capacitor 433. Here, since the transmission gate 443 is activated, the charged voltage of the capacitor 433 is applied to input and output terminals of the inverter 451. Hence, a voltage at each of the input and output terminals of the inverter 451 rises to half the charged voltage of the capacitor 433. When the second time slot t2 ends, the switching signals PS and PP become inactive to logic low and the transmission gates 442 and 443 are deactivated accordingly.

In this way, the signal stored in the pixel 311 is sampled by the CDS unit 341a for a first time and transmitted to the comparator 351a.

During a third time slot t3, the transmission signal TG becomes active to logic high. Then, electric charges generated by the optical diode 421 propagate to the capacitor 431, thereby lowering the voltage of the capacitor 431. In other words, the voltage of the capacitor 431 is reduced according to the amount of optical signals incident on the optical diode 421. Here, the switching signal PS becomes active to logic high again, and the transmission gate 442 is activated accordingly. Therefore, an input voltage of the inverter 451 is lowered by the same voltage by which the voltage of the capacitor 433 is reduced. Conversely, an output voltage of the inverter 451 rises by the same voltage by which the voltage of the capacitor 433 is reduced.

During the third time slot t3, the switching signal PR becomes active to logic high and thus the transmission gate 441 is activated. Accordingly, the ramp voltage Vramp1 output from the ramp voltage generator 321 is transmitted to the comparator 351a. When the third time slot t3 ends, the transmission signal TG and the switching signal PS become inactive to logic low. Consequently, the NMOS transistor 412 and the transmission gate 442 are deactivated, and a voltage level of the signal transmitted to the transmission gate 442 is reduced to a level of a ground source.

In this way, the signal stored in the pixel 311 is sampled by the CDS unit 341a for a second time and transmitted to the comparator 351a.

During a fourth time slot t4, the ramp enable signal rampen1 and the count enable signal counten1 become active. Then, a signal of the ramp voltage Vramp1 output from the ramp voltage generator 321 is transmitted to an input terminal of the comparator 351a. When the ramp voltage Vramp1 is lower than a threshold voltage, the output signal OUT1 of the comparator 351a is output as logic high, and when the ramp voltage Vramp1 exceeds the threshold voltage, the output signal OUT1 of the comparator 351a switches to logic low.

Also during the fourth time slot t4, the counter 331 counts the number of pulses of the clock signal CLK. For example, the counter 331 starts to count the number of pulses of the clock signal CLK from when the count enable signal counten1 becomes active and stops counting the number of pulses of the clock signal CLK when the output signal OUT1 of the comparator 351a switches to logic low. Here, the number of pulses counted is output as digital data of the first columnar analog-digital converter 221.

As described above, the signal stored in the pixel 311 is converted into digital data by the first columnar analog-digital converter 221 and then output. The second columnar analog-digital converter 222 also converts a signal stored in another pixel into digital data by performing the same or similar operations. Thus, the operation of the second columnar analog-digital converter 222 is similar to or the same as that described for the first column analog-digital converter 222. Accordingly, a description of the operation of the second columnar analog-digital converter 222 is omitted.

Figure 6:
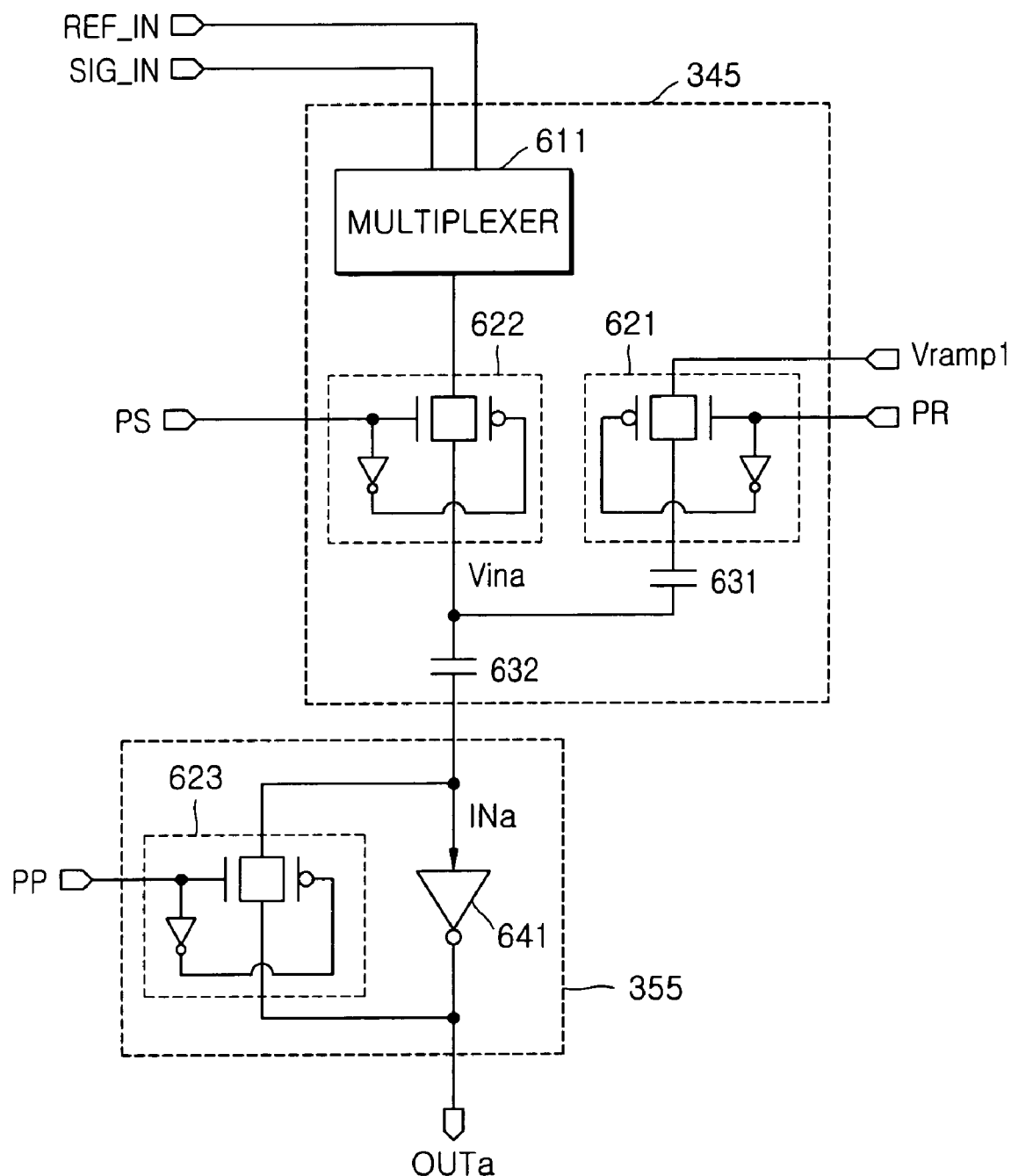
FIG. 6 is a circuit diagram of a test CDS unit and a test comparator included in a first test analog-digital converter illustrated in FIG. 3.

FIG. 6 is a circuit diagram of the test CDS unit 345 and the test comparator 355 included in the first test analog-digital converter 241 illustrated in FIG. 3. Referring to FIG. 6, the test CDS unit 345 includes a multiplexer 611, transmission gates 621 and 622, and capacitors 631 and 632. The test comparator 355 includes a transmission gate 623 and an inverter 641.

The transmission gates 621, 622, and 623 are respectively activated when the switching signals PR, PS, and PP become active to logic high and deactivated when the switching signals PR, PS, and PP become inactive to logic low.

Figure 7:
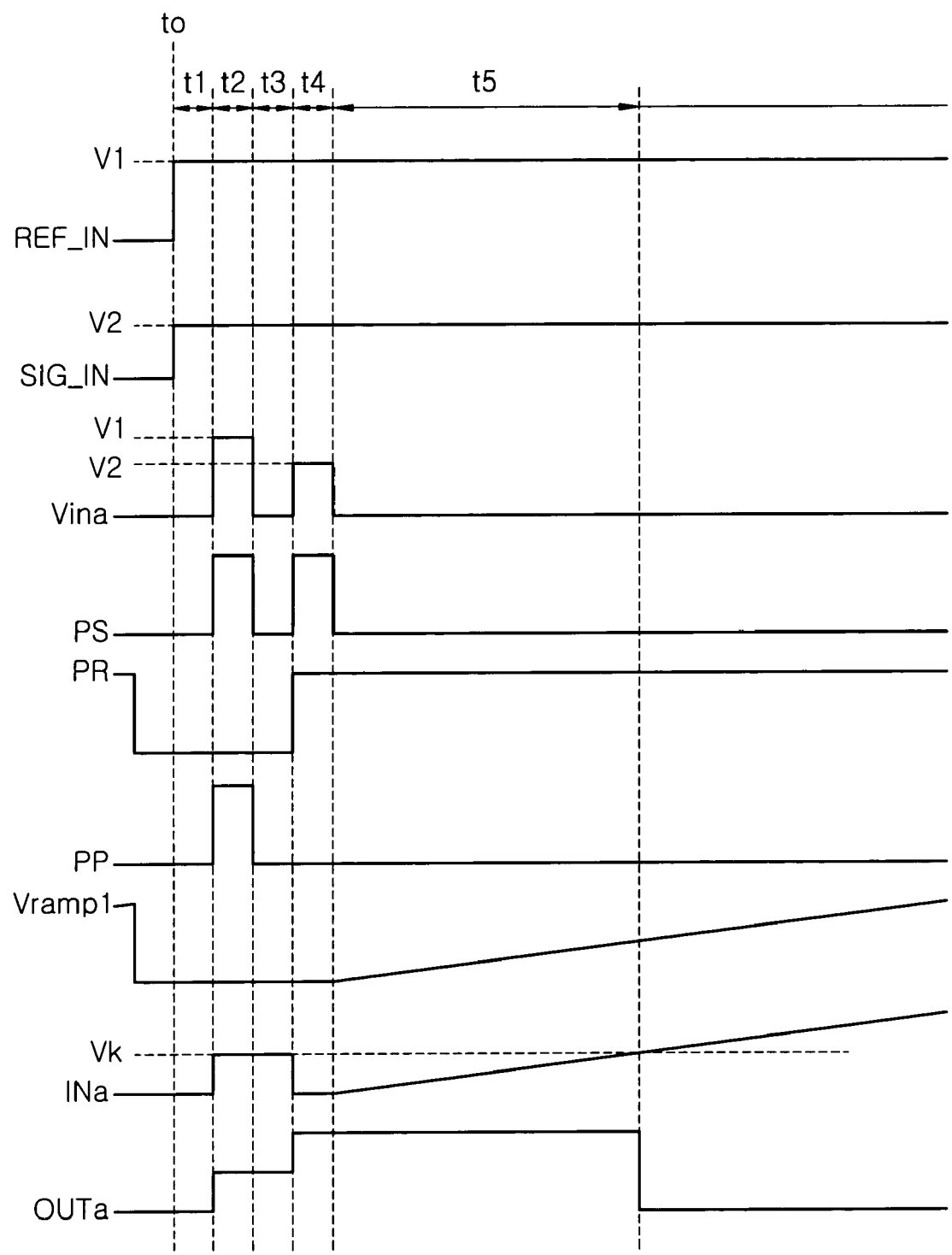
FIG. 7 is a timing diagram of some of the signals illustrated in FIGS. 3 and 6, which are used to describe the operation of the first test analog-digital converter of FIG. 6.

FIG. 7 is a timing diagram of some of the signals illustrated in FIGS. 3 and 6, which are used to describe the operation of the first test analog-digital converter 241. The operation of the first test analog-digital converter 241 illustrated in FIGS. 3 and 6 will now be described with reference to FIG. 7.

During a first time slot t1, since the switching signals PR, PS and PP are inactive in the logic low state, the transmission gates 621 through 623 are deactivated.

During a second time slot t2, the first test signal REF_IN having a voltage level V1 is output from the multiplexer 611 and transmitted to the transmission gate 622. In addition, the switching signals PS and PP become active, thereby activating the transmission gates 622 and 623. Thus, the first test signal REF_IN transmitted to the transmission gate 622 passes through the transmission gate 622 and charges the capacitor 632. Here, since the transmission gate 623 is activated, the charged voltage of the capacitor 632 is applied to input and output terminals of the inverter 641. Hence, a voltage of each of the input signal INa and the output signal OUTa of the inverter 641 rises to half the charged voltage of the capacitor 632.

In this way, the first test signal REF_IN is sampled by the test CDS unit 345 for a first time and transmitted to the test comparator 355.

During a third time slot t3, the switching signals PS and PP become inactive to logic low and the transmission gates 622 and 623 are deactivated accordingly.

During a fourth time slot t4, the second test signal SIG_IN having a voltage level V2 is transmitted to the transmission gate 622 through the multiplexer 611. In addition, the switching signals PS and PR become active to logic high, thereby activating the transmission gates 622 and 621. Then, the voltage of the capacitor 632 is lowered by a differential voltage vk, which is the difference between the first test signal REF_IN and the second test signal SIG_IN. Accordingly, the voltage of the input signal INa of the inverter 451 is lowered by the differential voltage vk, and the output signal OUTa of the inverter 451 rises by the differential voltage vk.

In this way, the second test signal SIG_IN is sampled by the test CDS unit 345 for a first time and transmitted to the test comparator 355.

During a fifth time slot t5, the switching signal PS becomes inactive to logic low and the transmission gate 622 is deactivated accordingly. In addition, the ramp enable signal rampen1 becomes active to logic high. Accordingly, the ramp voltage Vramp1 output from the ramp voltage generator 321 is applied to the inverter 641 across the transmission gate 621 and the capacitors 631 and 632. Then, a voltage at the input terminal of the inverter 641 starts to rise.

When the ramp enable signal rampen1 becomes active, the count enable signal counten1 becomes active as well. Accordingly, the counter 331 is activated and starts to count the number of pulses of the clock signal CLK.

When the ramp voltage Vramp1 reaches a threshold voltage, e.g., a voltage applied to the input terminal of the inverter 641 during the second time slot t2, the output signal OUTa of the inverter 641 switches from logic high to logic low. At this moment, the counter 331 stops counting.

Here, the number of pulses counted is output as digital data of the first test analog-digital converter 241.

The second test analog-digital converter 242 also performs operations similar to or the same as the first test analog-digital converter 241. Accordingly, a description of the operation of the second test analog-digital converter 242 is omitted.

As described above, the operating characteristics of the first and second columnar analog-digital converters 221 and 222 can be tested by transmitting the first and second test signals REF_IN and SIG_IN to the image pick-up semiconductor device 201 from an external source. Thus, the operating characteristics of the first and second columnar analog-digital converters 221 and 222 can be tested independently of the operation of the image pick-up semiconductor device 201.

For example, the amount of saturated signals, an offset voltage, and gain characteristics of the first and second columnar analog-digital converters 221 and 222 can be tested. In addition, if the test result indicates that the first and second columnar analog-digital converters 221 and 222 operate improperly, they can be made to operate properly through error compensation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image pick-up semiconductor device, comprising:
   an active pixel sensor array having a plurality of pixels converting optical signals input from an external source into electrical signals;
   a columnar analog-digital converter converting the electrical signals output from the active pixel sensor array into first digital data; and
   a test analog-digital converter receiving two external signals and converting a voltage difference between the two external signals into second digital data, wherein the test analog-digital converter comprises:
   a test correlated double sampling unit sampling the two external signals;
   a test comparator receiving an output signal of the test correlated double sampling unit and a ramp voltage output from a ramp voltage generator of the columnar analog-digital converter and comparing voltage levels of the received signals; and
   a test latch unit receiving an output signal of the test comparator.

2. The device of claim 1, wherein the test analog-digital converter has identical operating characteristics to the columnar analog-digital converter.

3. The device of claim 1, wherein the test analog-digital converter is a dummy analog-digital converter.

4. An image pick-up semiconductor device, comprising:
   an active pixel sensor array having a plurality of pixels converting optical signals input from an external source into electrical signals;
   a columnar analog-digital converter converting the electrical signals output from the active pixel sensor array into first digital data; and
   a test analog-digital converter receiving two external signals and converting a voltage difference between the two external signals into second digital data, wherein the columnar analog-digital converter comprises:
   a ramp voltage generator generating a ramp voltage;
   a plurality of correlated double sampling units electrically connected to the pixels and each of the correlated double sampling units sampling a first electricat signal output from a first pixel at a first time and sampling a second electrical signal output from the first pixel at a second time;
   a plurality of comparators receiving output signals of the correlated double sampling units and the ramp voltage output from the ramp voltage generator and comparing voltage levels of the output signals and the ramp voltage;
   a counter receiving a clock signal and a count enable signal input from an external source, and counting and outputting a number of pulses of the clock signal from when the ramp voltage generator starts to output the ramp voltage; and
   a plurality of latch units storing digital data output from the counter as the first digital data when voltage levels of output signals of the comparators are inverted.

5. The device of claim 4, wherein the first digital data is the number of counted pulses.

6. The device of claim 4, wherein the ramp voltage generator receives a ramp voltage enable signal from an external source and outputs the ramp voltage when the ramp voltage enable signal becomes active.

7. The device of claim 4, wherein the latch unit stores the number of pulses counted from when the ramp voltage generator starts to output the ramp voltage to when the voltage levels of the output signals of the comparators switch from a first logic level to a second logic level.

8. The device of claim 1,
   wherein a counter of the columnar analog-digital converter counts and outputs the number of pulses of a received clock signal from when the ramp voltage starts to rise, and the test latch unit stores the number of pulses of the clock signals counted as the second digital data until the output signal of the test comparator is inverted.

9. The device of claim 8, wherein the ramp voltage generator outputs the ramp voltage when a ramp voltage enable signal input from an external source becomes active.

10. The device of claim 8, wherein the counter starts to count the number of pulses of the clock signal when a count enable signal input from an external source becomes active.

11. The device of claim 8, wherein the test latch unit stores the number of counted pulses when the voltage level of the output signal of the test comparator switches from a first logic level to a second logic level.

12. An image pick-up semiconductor device, comprising:
   an active pixel sensor array in which a plurality of pixels converting optical signals input from an external source into electrical signals are arranged;
   a plurality of columnar analog-digital converters disposed on sides of the active pixel sensor array and converting signals output from the active pixel sensor array into first digital data; and
   a plurality of test analog-digital converters disposed on the sides of the active pixel sensor array, receiving two external signals, and converting a voltage difference between the two external signals into second digital data, wherein each of the test analog-digital converters comprises:
   a test correlated double sampling unit sampling the two external signals;
   a test comparator receiving an output signal of the test correlated double sampling unit and a ramp voltage output from a ramp voltage generator of one of the columnar analog-digital converters and comparing voltage levels of the received signals; and
   a test latch unit receiving an output signal of the test comparator.

13. The device of claim 12, wherein the test analog-digital converters have identical operating characteristics to the columnar analog-digital converters.

14. The device of claim 12, wherein the test analog-digital converters are dummy analog-digital converters.

15. An image pick-up semiconductor device, comprising:
   an active pixel sensor array in which a plurality of pixels converting optical signals input from an external source into electrical signals are arranged;
   a plurality of columnar analog-digital converters disposed on sides of the active pixel sensor array and converting signals output from the active pixel sensor array into first digital data; and
   a plurality of test analog-digital converters disposed on the sides of the active pixel sensor array, receiving two external signals, and converting a voltage difference between the two external signals into second digital data, wherein each of the columnar analog-digital converters comprises:
   a ramp voltage generator generating a ramp voltage;
   a plurality of correlated double sampling units electrically connected to the pixels and each of the correlated double sampling units sampling a first electrical signal output from a first pixel at a first time and sampling a second electrical signal output from the first pixel at a second time;

a plurality of comparators receiving output signals of the correlated double sampling units and the ramp voltage output from the ramp voltage generator and comparing voltage levels of the output signals and the ramp voltage;

a counter receiving a clock signal and a count enable signal input from an external source, and counting and outputting a number of pulses of the clock signal from when the ramp voltage generator starts to output the ramp voltage; and a plurality of latch units storing digital data output from the counter as the first digital data when voltage levels of output signals of the comparators are inverted.

16. The device of claim 15, wherein the first digital data is the number of counted pulses.

17. The device of claim 15, wherein the ramp voltage generator receives a ramp voltage enable signal from an external source and outputs the ramp voltage when the ramp voltage enable signal becomes active.

18. The device of claim 15, wherein the latch unit stores the number of counted pulses when the voltage level of the output signal of the test comparator switches from a first logic level to a second logic level.

19. The device of claim 12,
wherein a counter of one of the columnar analog-digital converters counts and outputs the number of pulses of a received clock signal from when the ramp voltage starts to rise, and the test latch unit stores the number of pulses of the clock signals counted as the second digital data until the output signal of the test comparator is inverted.

20. The device of claim 19, wherein the ramp voltage generator outputs the ramp voltage when a ramp voltage enable signal input from an external source becomes active.

21. The device of claim 19, wherein the counter starts to count the number of pulses of the clock signal when a count enable signal input from an external source becomes active.

22. The device of claim 19, wherein test the latch unit stores the number of counted pulses when the voltage level of the output signal of the test comparator switches from a first logic level to a second logic level.

23. A method for testing operating characteristics in an image pick-up semiconductor device, comprising:

converting at an active pixel sensor in which a plurality of pixels are arranged, optical signals input from an external source into electrical signals;

converting, at a columnar analog-digital converter, the electrical signals output from the active pixel sensor array into first digital data;

receiving, at a test analog-digital converter, two external signals and converting a voltage difference between the two external signals into second digital data;

setting the voltage difference between the two external signals to a saturated voltage of the pixels; and determining an amount of saturated signals in the image pick-up semiconductor device based on the second digital data.

24. A meted for testing operating characteristis in an image pick-up semiconductor device, comprising:

converting, at an active pixel sensor in which a plurality of pixels are arranged, optical signals input from an external source into electrical signals;

converting, at a columnar analog-digital converter, the electrical signals output from the active pixel sensor array into first digital data;

receiving, at a test analog-digital converter, two external signals and converting a voltage difference between the two external signals into second digital data;

setting the two external signals to a same voltage level; and determining an offset voltage of the columnar analog-digital converter based on the second digital data.

wherein if a non-zero offset voltage has been determined, setting the offset voltage to zero by adjusting a counter of the columnar analog-digital converter.

25. The method of claim 23, further comprising:

increasing the voltage difference of the two external signals; and determining if gain characteristics of the columnar analog-digital converter are stable based on whether the second digital data increases at a same rate as the increase in the voltage difference of the two external signals.

* * * * *